United States Patent
Krishnan et al.

(10) Patent No.: US 7,071,092 B2
(45) Date of Patent: Jul. 4, 2006

(54) METHOD OF MANUFACTURING ANTENNA PROXIMITY LINES

(75) Inventors: Anand T. Krishnan, Richardson, TX (US); Srikanth Krishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/042,669

(22) Filed: Jan. 25, 2005

(65) Prior Publication Data

US 2005/0133826 A1    Jun. 23, 2005

Related U.S. Application Data

(62) Division of application No. 10/394,569, filed on Mar. 21, 2003, now Pat. No. 6,969,902.

(51) Int. Cl.
*H01L 21/4763* (2006.01)
*H01L 23/52* (2006.01)

(52) U.S. Cl. .................. 438/622; 257/E21.575
(58) Field of Classification Search ............. 438/618, 438/621, 622
See application file for complete search history.

(56) References Cited

U.S. PATENT DOCUMENTS

| 6,030,706 | A  | * | 2/2000 | Eissa et al. ............. 428/421 |
| 6,262,446 | B1 | * | 7/2001 | Koo et al. ............... 257/296 |
| 6,511,908 | B1 | * | 1/2003 | Kinoshita et al. ......... 438/637 |
| 6,841,843 | B1 | * | 1/2005 | Ohkubo et al. ............ 257/467 |
| 2002/0074589 | A1 | * | 6/2002 | Benaissa et al. .......... 257/312 |

* cited by examiner

*Primary Examiner*—Anh Duy Mai
(74) *Attorney, Agent, or Firm*—Rose Alyssa Keagy; W. James Brady, III; Frederick J. Telecky, Jr.

(57) ABSTRACT

An embodiment of the invention is an integrated circuit 2 having antenna proximity lines 3 coupled to the semiconductor substrate 5. Another embodiment of the invention is a method of manufacturing an integrated circuit 2 having antenna proximity lines 3 coupled to the semiconductor substrate 5.

7 Claims, 2 Drawing Sheets

METHOD OF MANUFACTURING ANTENNA PROXIMITY LINES

This is a division of application Ser. No. 10/394,569, filed Mar. 21, 2003 now U.S. Pat. No. 6,969,902.

BACKGROUND OF THE INVENTION

This invention relates to the structure and the method of manufacturing semiconductor antenna proximity lines.

DETAILED DESCRIPTION OF THE INVENTION

Figure 1:
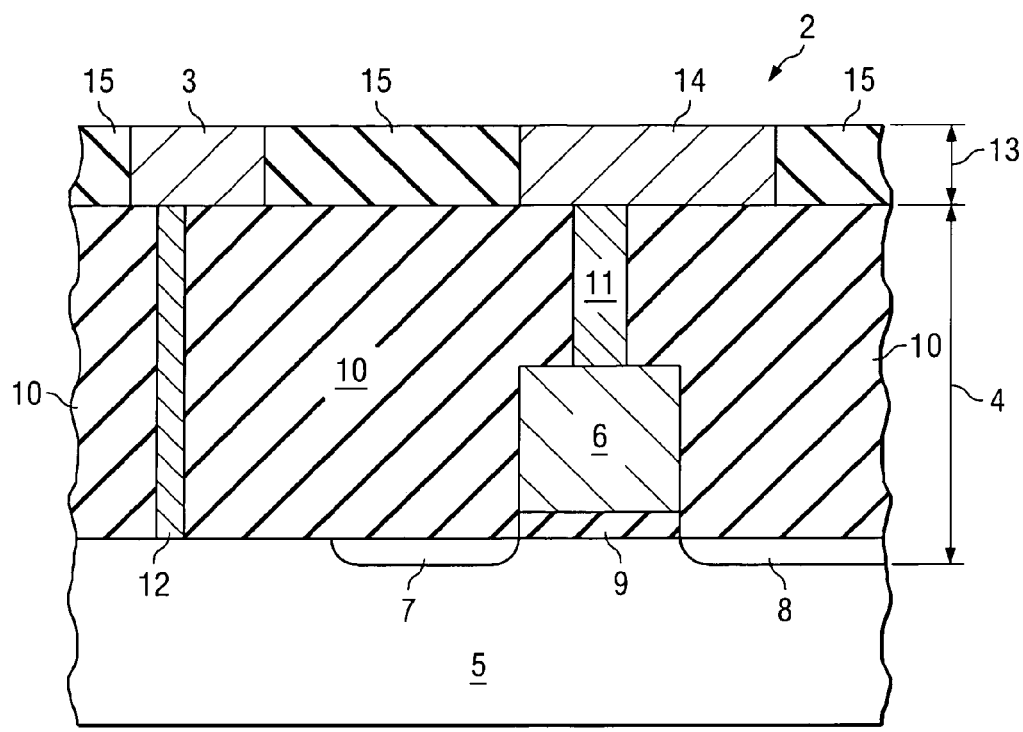
FIG. 1 is a cross-section view of a semiconductor having antenna proximity lines in accordance with an embodiment of the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of a portion of a semiconductor 2 having an antenna proximity line 3 in accordance with a first embodiment of the present invention. The example semiconductor 2 has a transistor level 4 formed on (and within) a substrate 5. FIG. 1 depicts a transistor having gate oxide 9, a gate electrode 6, and source/drain 7, 8; however, it is within the scope of the invention to have any form of logic within the transistor level 4.

Dielectric insulation 10 surrounds the transistor and other logic elements contained in the transistor level 4. The dielectric 10 also surrounds logic contacts 11 which electrically tie the transistor to the other logic elements (not shown) of the transistor level 4. Furthermore, dielectric 10 surrounds contacts 12 which electrically tie the antenna proximity line 3 to the substrate 5. As an example, the composition of dielectric insulation 10 may be $SiO_2$ and contacts 11 and 12 may comprise W.

The metal level 13 shown in FIG. 1 contains an example metal interconnect 14 in addition to an example antenna proximity line 3. The metal interconnect 14 is used to properly route electrical signals or power through the electronic device. Dielectric material 15 provides electrical insulation for the metal interconnect 14 and the antenna proximity line 3. The dielectric 15 may be any insulative material such as Organo-Silicate Glass ("OSG"). The metal interconnect 14 and antenna proximity line 3 may be comprised of any electrically conductive material such as copper. However, the use of other metals such as aluminum or titanium is within the scope of this invention.

As shown in FIG. 1, the antenna proximity line 3 is electrically coupled to the substrate 5 through contact 12. The antenna proximity structure (formed by antenna proximity line 3 plus a contact 12) provides electrical protection to the logic elements contained within the transistor level 4. For example, during manufacturing processes involving plasma deposition or plasma etch, the antenna proximity structure provides a low resistance path to ground for the charge to dissipate—thereby reducing the likelihood that the charge will dissipate through the gate oxide 9. In addition, the antenna proximity structure may reduce plasma non-uniformity and also provide a low resistance path for excess currents during transients.

Figure 2:
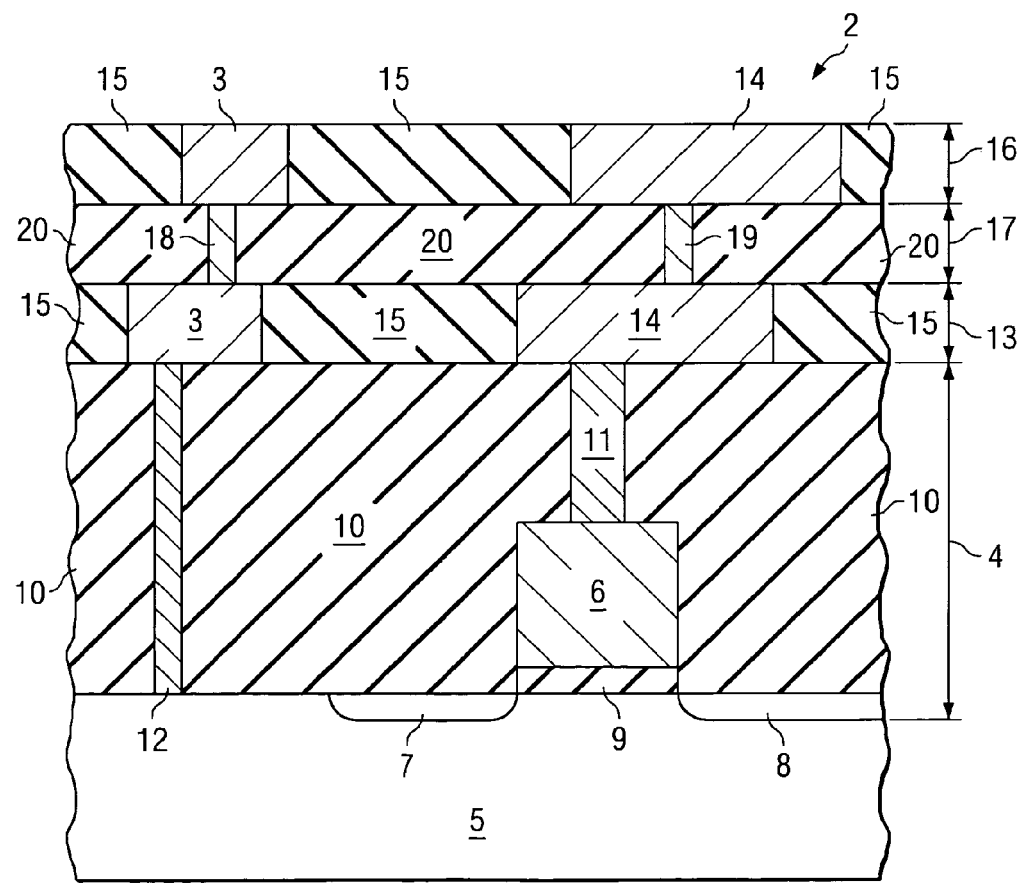
FIG. 2 is a cross-section view of a semiconductor having antenna proximity lines in accordance with another embodiment of the present invention.

It is within the scope of this invention to have numerous antenna proximity lines 3 or metal interconnects 14. Moreover, it is within the scope of this invention to have more than one metal level 13. FIG. 2 is a cross-section view of a semiconductor having antenna proximity lines in accordance with another embodiment of the present invention. The semiconductor 2 shown in FIG. 2 has more than one metal level. A second metal level 16 contains additional metal interconnects 14 for routing electrical signals or power to the electronic device. Furthermore, the second metal level 16 has additional antenna proximity lines 3 that are electrically coupled to the substrate 5. Similar to the first metal level 13, the metal features of the second metal level 16 comprise any metal material such as copper. In addition the dielectric material 15 of the second metal level 16 may be any insulative material such as OSG.

Between the first metal level 13 and the second metal level 16 may be a via level 17. Contained with the vial level 17 are vias 18, 19 that are electrically insulated by dielectric regions 20. As an example, the vias 18, 19 may comprise a metal such as copper, and the dielectric regions 20 may comprise an insulator such as OSG. The vias 18 electrically connect the antenna proximity lines 3 between adjacent metal levels such as 13 and 16. In addition, the vias 19 electrically connect the metal interconnects 14 between adjacent metal levels such as 13 and 16 in accordance with the electrical design of the integrated circuit. The invention is not confined to integrated circuits having only one (FIG. 1) or two (FIG. 2) metal levels. It is within the scope of the present invention to design a semiconductor 2 having three or more metal levels containing metal interconnects 14 and antenna proximity lines 3.

Figure 3:
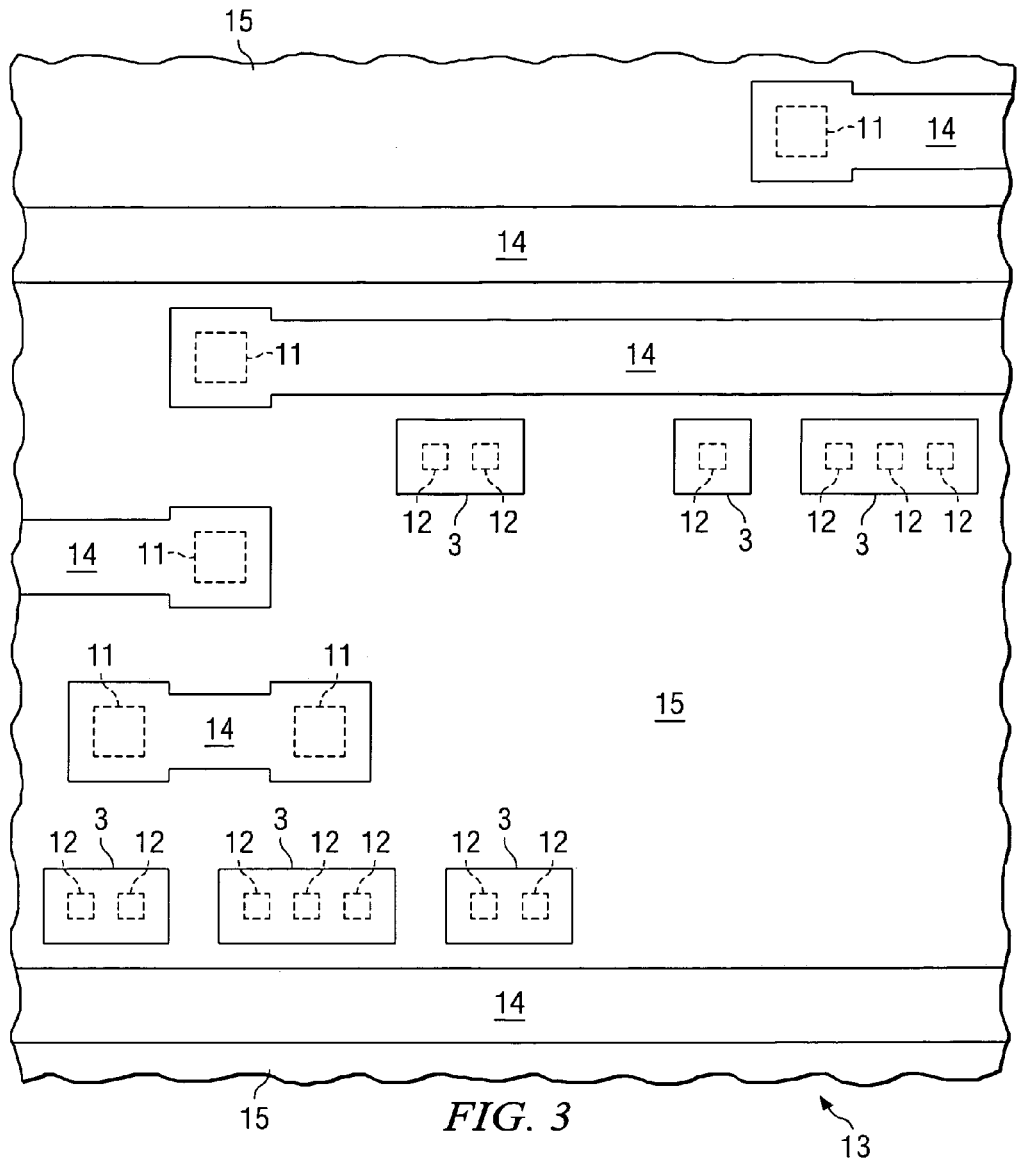
FIG. 3 is a top view of a metal interconnect layer having antenna proximity lines in accordance with an embodiment of the present invention.

FIG. 3 is a top view of a metal layer (such as 13 or 16) having antenna proximity lines 3 in accordance with an embodiment of the present invention. If the metal layer shown in FIG. 3 is metal layer 13, then metal interconnects 14 will be coupled to the logic elements of the transistor level through one or more contacts 11. The antenna proximity lines 3 will be placed close to metal interconnects 14 and will be coupled to the substrate through one or more contacts 12. In the best mode application, the spacing between the antenna proximity lines 3 and the metal interconnects 14 is less than 1.5 μm. However, the spacing may be as close as design rules and manufacturing capabilities will allow.

If the metal level shown in FIG. 3 was a metal level such as metal level 16, which is a metal level other than the first metal level, than the antenna proximity lines 3 would be electrically coupled to a higher and/or lower metal level through vias 18. Similarly, if the metal level of FIG. 3 was a metal level such as metal level 16, than the metal interconnects 14 would be coupled to a higher and/or lower metal level through vias 19.

Figure 4:
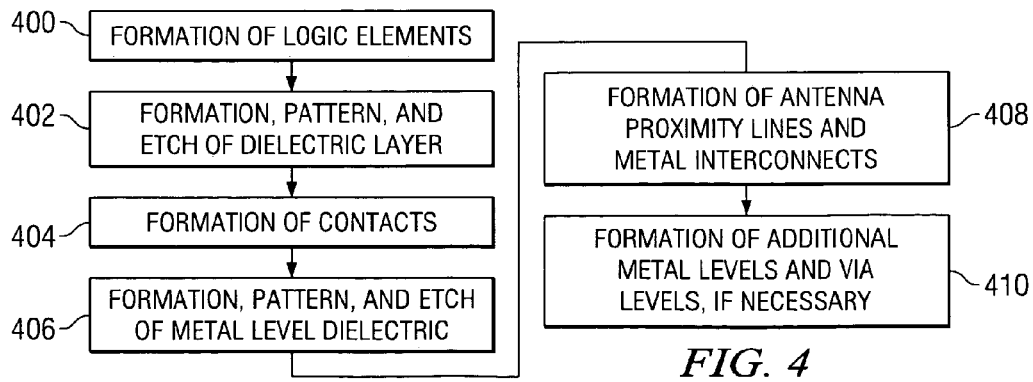
FIG. 4 is a flow diagram illustrating the process flow of one embodiment of the present invention.

FIG. 4 is a flow diagram illustrating the process flow of one embodiment of the present invention that is shown in FIG. 1. At the beginning of the manufacturing process the transistor level 4 is fabricated over the substrate 5. The first step is that the logic elements are formed (step 400) on and within the substrate 5. Because the present invention may be used in any integrated circuit configuration, the transistor level 4 may be fabricated to perform any device function. Furthermore, any well-known manufacturing process may be used to form the transistor shown in FIG. 1. The gate oxide layer 9 (preferably comprised of silicon dioxide, an oxynitride, a silicon nitride, BST, PZT, a silicate, any other high-k material, or any combination or stack thereof) would be formed on the substrate 5. A gate electrode 6 (preferably comprised of polycrystalline silicon doped either p-type or n-type with a silicide formed on top, or a metal such as titanium, tungsten, TiN, tantalum, or TaN) is then formed on the gate oxide layer 9. The source/drain regions 7, 8 are implanted using a dopant such as As and a process technique such as ion implantation.

Next (step 402), a dielectric layer 10 is formed over the entire wafer surface and is patterned and etched to form openings for contacts to the substrate and gate structures. These openings are filled with conductive materials, such as tungsten, to form (step 404) the contacts that connect to the substrate (12), the gate (11), and the source/drain regions (not shown). The dielectric layer 10 may be comprised of any insulative material, such as $SiO_2$.

The metal level 13 is now fabricated over the transistor level 4. The metal level dielectric layer 15 is formed (step 406) using any industry manufacturing process such as Chemical Vapor Deposition ("CVD"). In this example application, the dielectric 15 is comprised of OSG; however, any dielectric material may be used. The dielectric layer 15 is then patterned and etched to form holes for the antenna proximity lines and metal interconnects.

A metal layer is now formed (step 408) over the substrate. In the best mode application, the metal layer is copper; however, the use of other metals such as aluminum or titanium are within the scope of this invention. The metal layer is polished until the top surface of the dielectric 15 is exposed and the antenna proximity lines 3 and the metal interconnects 14 are formed. In the best mode application, the polishing process is performed using a Chemical Mechanical Polish ("CMP"); however, other manufacturing techniques may be used.

If the integrated circuit design requires additional metal levels, such as metal level 16 shown in FIG. 2, then they are now manufactured (step 410) with a process similar to the process used to create metal level 13. It is to be noted that a via level 17 is usually formed between the metal levels (13, 16). The via level 17 may also be made with the same dielectric and metal materials as the metal levels.

Various modifications to the invention as described above are within the scope of the claimed invention. For example, the antenna proximity lines may not be located in every metal layer. Instead of using copper to make the antenna proximity lines 3, the vias 18, 19 and the metal interconnects 14; other metals such as silver, aluminum, or titanium may be used. In addition, it is within the scope of the invention to have an integrated circuit with a different number or configuration of metal and via layers 13, 16, 17. For example, instead of the path being substantially direct from the antenna proximity line 3 of the second metal level 16 to the substrate 5 (as shown in FIG. 2), the antenna proximity line in the second metal level 16 may be coupled (by via 18) to an antenna proximity line in the first metal level 13 at one wafer location—yet the antenna proximity line in the first metal level 13 may be coupled to the substrate (by contact 12) at a much different wafer location. Furthermore, it is within the scope of the invention to have antenna proximity lines that are of different shapes, sizes, locations or quantities than the example illustrations in FIGS. 1–3. The invention is applicable to semiconductor wafers having different well and substrate technologies, transistor configurations, and metal connector materials or configurations. Moreover, the invention is applicable to any semiconductor technology such as CMOS, BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing an integrated circuit comprising:
    forming a transistor level containing logic elements over a semiconductor substrate, said transistor level including semiconductor substrate contacts, said semiconductor substrate contacts having direct contact with said semiconductor substrate, said transistor level also including logic element contacts, said logic element contacts having direct contact with said logic elements;
    forming a first dielectric layer over said transistor level;
    etching said first dielectric layer to form voids for first level metal interconnects and first level antenna proximity lines; and
    forming said first level metal interconnects and said first level antenna proximity lines, said first level antenna proximity lines being coupled to said semiconductor substrate contacts, and said first level metal interconnects being coupled to said logic element contacts.

2. The method of claim 1 wherein said first level antenna proximity lines comprise copper.

3. The method of claim 1 further comprising:
    forming a second dielectric layer in direct contact with said first dielectric layer;
    etching said second dielectric layer to form voids for second level metal interconnects and second level antenna proximity lines; and
    forming said second level metal interconnects and said second level antenna proximity lines, said second level antenna proximity lines being coupled to said semiconductor substrate contacts, and said second level metal interconnects being coupled to said logic element contacts.

4. The method of claim 1 wherein said first level antenna proximity lines are spaced less than 1.5 μm from an edge of said first level metal interconnects.

5. The method of claim 3 wherein said second level antenna proximity lines are spaced less than 1.5 μm from an edge of said second level metal interconnects.

6. The method of claim 1 further comprising:
   forming a second dielectric layer in direct contact with said first dielectric layer;
   etching said second dielectric layer to form voids for second level metal interconnects, second level antenna proximity lines, and vias; and
   forming said second level metal interconnects, said second level antenna proximity lines, and vias; wherein said second level antenna proximity lines are coupled to said semiconductor substrate contacts and said second level metal interconnects are coupled to said logic element contacts.

7. The method of claim 6 wherein said second level antenna proximity lines are spaced less than 1.5 μm from an edge of said second level metal interconnects.

* * * * *